United States Patent
Yen

(10) Patent No.: US 9,831,228 B2
(45) Date of Patent: Nov. 28, 2017

(54) OPTO-ELECTRONIC APPARATUS AND MANUFACTURING METHOD THEREOF

(71) Applicant: ULTRA DISPLAY TECHNOLOGY CORP., Taipei (TW)

(72) Inventor: Yung-Yu Yen, New Taipei (TW)

(73) Assignee: Ultra Display Technology Corp., Taipei (TW)

( * ) Notice: Subject to any disclaimer, the term of this patent is extended or adjusted under 35 U.S.C. 154(b) by 0 days.

(21) Appl. No.: 15/379,962

(22) Filed: Dec. 15, 2016

(65) Prior Publication Data

US 2017/0170160 A1 Jun. 15, 2017

(30) Foreign Application Priority Data

Dec. 15, 2015 (TW) .............................. 104142149 A

(51) Int. Cl.
*H01L 33/00* (2010.01)
*H01L 25/00* (2006.01)
(Continued)

(52) U.S. Cl.
CPC .............. *H01L 25/50* (2013.01); *H01L 24/83* (2013.01); *H01L 24/97* (2013.01); *H01L 25/167* (2013.01); *H01L 27/1248* (2013.01); *H01L 27/1262* (2013.01); *H01L 33/62* (2013.01); *H01L 2224/83139* (2013.01); *H01L 2224/83851* (2013.01); *H01L 2224/83951* (2013.01); *H01L 2224/95001* (2013.01); *H01L 2224/95136* (2013.01); *H01L 2924/0781* (2013.01); *H01L 2924/12041* (2013.01); *H01L 2924/1426* (2013.01); *H01L 2924/1515* (2013.01); *H01L 2933/0066* (2013.01)

(58) Field of Classification Search
CPC ....... H01L 25/50; H01L 25/167; H01L 24/83; H01L 24/97; H01L 27/1248; H01L 27/1262; H01L 33/62; H01L 2224/83139; H01L 2224/83851; H01L 2224/83951; H01L 2224/95001; H01L 2224/95136; H01L 2924/0781; H01L 2924/12041; H01L 2924/1426; H01L 2924/1515
USPC ............................................................ 257/91
See application file for complete search history.

(56) References Cited

U.S. PATENT DOCUMENTS

| 2013/0210194 A1* | 8/2013 | Bibl | ........................ H01L 24/83 438/107 |
| 2014/0367633 A1* | 12/2014 | Bibl | .................. G02F 1/133603 257/13 |
| 2017/0062683 A1* | 3/2017 | Chen | ........................ H01L 33/62 |

* cited by examiner

Primary Examiner — Tu-Tu Ho
(74) Attorney, Agent, or Firm — Muncy, Geissler, Olds & Lowe, P.C.

(57) ABSTRACT

An opto-electronic apparatus and a manufacturing method thereof are disclosed. The manufacturing method of the opto-electronic apparatus includes the following steps of: disposing a matrix circuit on a substrate, wherein the matrix circuit has a matrix circuit thickness between the highest point of the matrix circuit and the surface of the substrate; disposing a plurality of first protrusions above the substrate, wherein at least one of the first protrusions has a first protrusion thickness between the highest point of the first protrusion and the surface of the substrate, and the first protrusion thickness is greater than the matrix circuit thickness; and performing a transfer step for transferring a plurality of first opto-electronic units from a first carrier to the first protrusions and bonding the first protrusions to at least two of the first opto-electronic units with an adhesive material.

19 Claims, 16 Drawing Sheets

(51) Int. Cl.
*H01L 23/00* (2006.01)
*H01L 25/16* (2006.01)
*H01L 27/12* (2006.01)
*H01L 33/62* (2010.01)

OPTO-ELECTRONIC APPARATUS AND MANUFACTURING METHOD THEREOF

CROSS REFERENCE TO RELATED APPLICATIONS

This Non-provisional application claims priority under 35 U.S.C. §119(a) on Patent Application No(s). 104142149 filed in Taiwan, Republic of China on Dec. 15, 2015, the entire contents of which are hereby incorporated by reference.

BACKGROUND OF THE INVENTION

Field of Invention

The present invention relates to an electronic apparatus and, in particular, to an opto-electronic apparatus and a manufacturing method thereof.
Related Art Recently, the micro LED array display device composed of micro LEDs (μLED) has been developed. Compared to the conventional LED display device, the micro LED array display device does not need additional backlight source, so that it can be easily manufactured with light weight and thinner size. Compared to the self-illumination OLED display device, the micro LED array display device is more stable and reliable, and does not have the image sticking issue. In addition, the micro LED can be widely applied to various applications, such as the micro projector, head-mounted display device, or head-up display device. Besides, the micro LED can be used in the future high-resolution display device.

However, the size of the micro LED is about 50 μm, so the fabrication of the display device with the micro LED needs higher precision requirement then the display device made of the conventional LED, which is usually over 100 μm. Accordingly, the manufacturing time and cost utilizing the micro LED are increased. If directly using a pick-up head to grab a plurality of micro LEDs from the carrier and transfer them to the matrix substrate, the micro LEDs may easily have interferences with other components configured on the matrix substrate due to the fine size of the micro LEDs. These undesired interferences can cause the poor quality of the manufactured display panel, and will increase the cost in the later inspection and repair procedures.

Therefore, it is desired to decrease the possible interferences between the small size opto-electronic units (e.g. micro LEDs) and the other components configured on the matrix substrate during the manufacturing process, thereby avoiding the additional manufacturing costs.

SUMMARY OF THE INVENTION

An objective of the present invention is to provide an opto-electronic apparatus and a manufacturing method thereof, which can decrease the damaged components caused by the collisions and interferences between the opto-electronic units and other components configured on the substrate, thereby improving the manufacturing yield of the opto-electronic apparatus.

To achieve the above objective, the present invention discloses a manufacturing method of an opto-electronic apparatus, which includes the following steps of: disposing a matrix circuit on a substrate, wherein the matrix circuit has a matrix circuit thickness between a highest point of the matrix circuit and a surface of the substrate; disposing a plurality of first protrusions above the substrate, wherein at least one of the first protrusions has a first protrusion thickness between a highest point of the first protrusion and the surface of the substrate, and the first protrusion thickness is greater than the matrix circuit thickness; and performing a transfer step for transferring a plurality of first opto-electronic units from a first carrier to the first protrusions and bonding the first protrusions to at least two of the first opto-electronic units with an adhesive material.

In one embodiment, the adhesive material is electrical conductive, and the first opto-electronic units are electrically connected to the matrix circuit by the adhesive material.

In one embodiment, the transfer step further includes: reversing the first carrier so that the first opto-electronic units are placed facing the matrix circuit; and aligning the first protrusions and the first opto-electronic units, which are located on the first carrier and are not disposed adjacent to one another.

In one embodiment, a pitch between two of the first opto-electronic units, which are located on the first carrier and are not disposed adjacent to one another, is equal to a pitch between two of the first protrusions, which are located on the substrate and are disposed adjacent to one another.

In one embodiment, the transfer step further includes: selecting a plurality of the first opto-electronic units, which are located on the first carrier and are not disposed adjacent to each other, by a polycrystalline selecting device; and placing the selected first opto-electronic units on the corresponding first protrusions by the polycrystalline selecting device.

In one embodiment, the manufacturing method further includes the following steps of: disposing a planarization layer to cover the first protrusions and at least a part of the first opto-electronic units; etching the planarization layer to form at least one opening for exposing a driving electrode disposed in the matrix circuit; and electrically connecting the driving electrode to a conductive portion of each of the first opto-electronic units.

In one embodiment, the manufacturing method further includes the following step of: disposing a plurality of second protrusions above the substrate, wherein at least one of the second protrusions has a second protrusion thickness between a highest point of the second protrusion and the surface of the substrate.

In one embodiment, the second protrusion thickness is greater than the first protrusion thickness.

In one embodiment, the manufacturing method further includes the following step of: performing a second transfer step for transferring a plurality of second opto-electronic units from a second carrier to the second protrusions and bonding the second protrusions to at least two of the second opto-electronic units with another adhesive material.

In one embodiment, a sum of the second protrusion thickness and a thickness of the second opto-electronic unit is greater than a sum of the first protrusion thickness and a thickness of the first opto-electronic unit.

To achieve the above objective, the present invention also discloses an opto-electronic apparatus, which includes a substrate, a matrix circuit, a plurality of first protrusions, and a plurality of first opto-electronic units. The matrix circuit is disposed on the substrate, and the first protrusions are disposed above the substrate. The matrix circuit has a matrix circuit thickness between a highest point of the matrix circuit and a surface of the substrate. The first opto-electronic units are bonded to the first protrusions by an adhesive material. At least one of the first protrusions has a first protrusion thickness between a highest point of the first protrusion and the surface of the substrate. The first protrusion thickness is greater than the matrix circuit thickness.

In one embodiment, the first protrusion has a top surface area, which is greater than 50% of a bottom surface area of the first opto-electronic unit.

In one embodiment, the adhesive material is electrical conductive, and the first opto-electronic units are electrically connected to the matrix circuit by the adhesive material.

In one embodiment, the first opto-electronic units are devices with two or three electrodes.

In one embodiment, the opto-electronic apparatus further includes a planarization layer covering the first protrusions and at least a part of the first opto-electronic units. The planarization layer has at least one opening for exposing a driving electrode disposed in the matrix circuit, and a conductive portion of each of the first opto-electronic units is electrically connected to the driving electrode.

In one embodiment, the opto-electronic apparatus further includes at least one black frame layer disposed on the planarization layer and surrounding at least one of the first opto-electronic units.

In one embodiment, the opto-electronic apparatus further includes at least one fluorescent layer disposed on at least a part of the first opto-electronic units.

In one embodiment, the opto-electronic apparatus further includes a cover disposed corresponding to the substrate.

In one embodiment, the cover further has a plurality of filter layers disposed corresponding to the first opto-electronic units.

In one embodiment, the first protrusions are arranged in a 2D array.

In one embodiment, the opto-electronic apparatus further includes a plurality of second protrusions and a plurality of second opto-electronic units. The second protrusions are disposed above the substrate, and at least one of the second protrusions has a second protrusion thickness between a highest point of the second protrusion and the surface of the substrate. The second opto-electronic units are bonded to the second protrusions by another adhesive material.

In one embodiment, a sum of the second protrusion thickness and a thickness of the second opto-electronic unit is greater than a sum of the first protrusion thickness and a thickness of the first opto-electronic unit.

In one embodiment, the second protrusion thickness is greater than the first protrusion thickness.

As mentioned above, the opto-electronic apparatus and manufacturing method thereof of the invention configure the protrusions on the substrate with a height design corresponding to other components, so that the collisions and interferences between the opto-electronic units and other components disposed on the substrate can be avoided during the transfer step of the opto-electronic units. Thus, the damages of the components due to the undesired collisions and interferences can be reduced. Accordingly, the manufacturing time can be shortened, the manufacturing yield can be improved, and the manufacturing cost can be decreased.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1A:
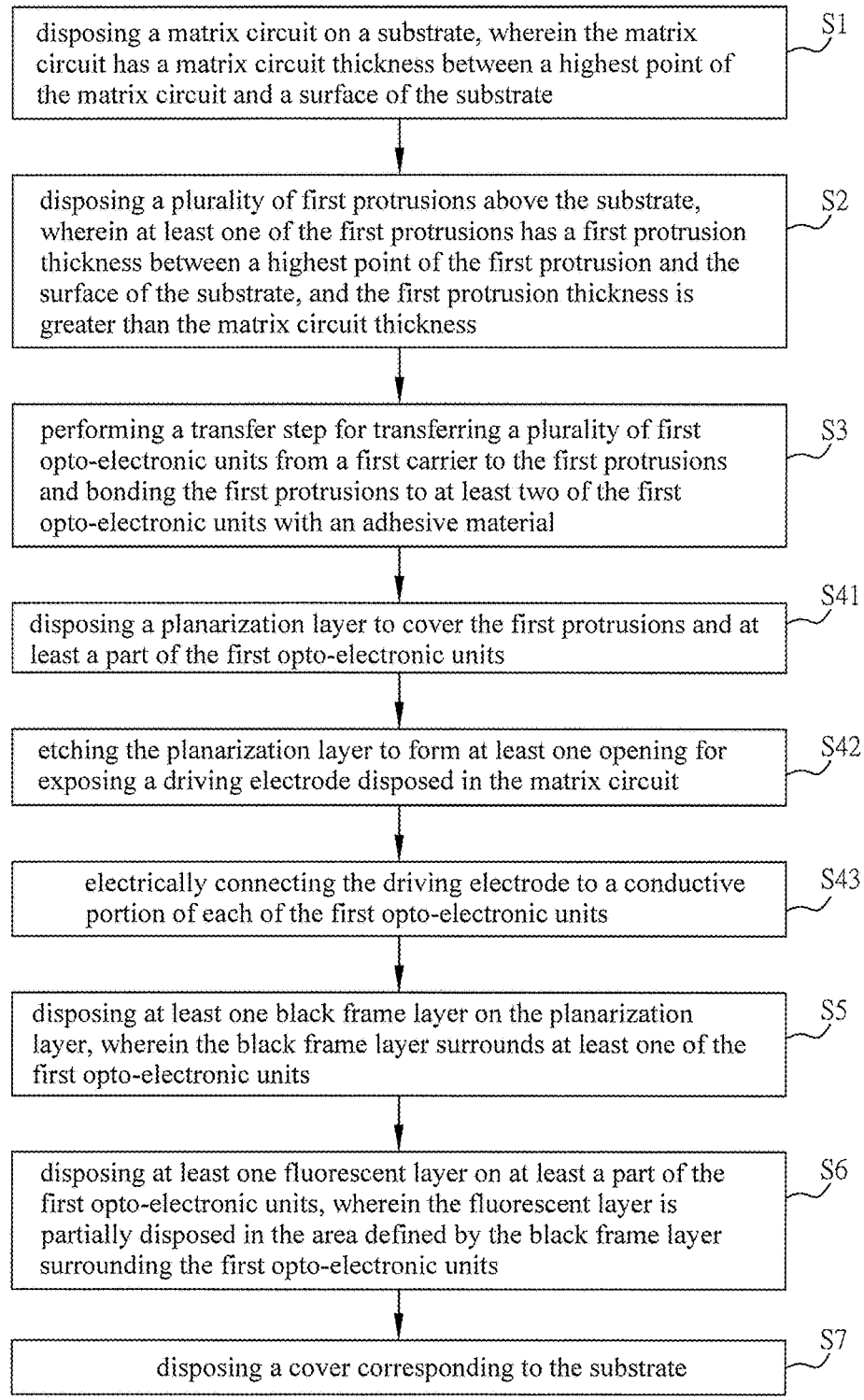
FIG. 1A is a flow chart of a manufacturing method of an opto-electronic apparatus according to an embodiment of the invention.

FIG. 1A is a flow chart of a manufacturing method of an opto-electronic apparatus according to an embodiment of the invention. The opto-electronic apparatus in the following embodiments can be a display panel, a multimedia board, a sensing apparatus, a semiconductor apparatus or an illumination apparatus, and this invention is not limited. The manufacturing method of an opto-electronic apparatus of the embodiment includes the following steps.

Figure 2A:
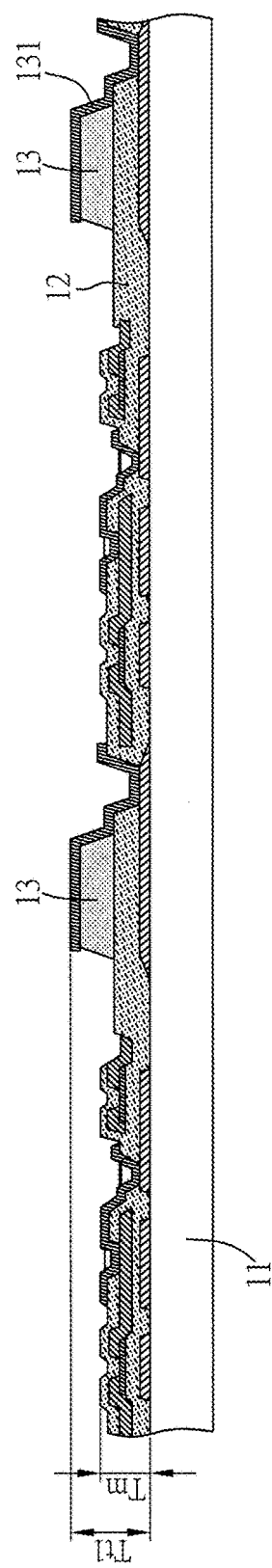
FIG. 2A is a schematic diagram showing the configurations of the substrate and the matrix circuit in the manufacturing method of an opto-electronic apparatus according to the embodiment of the invention.

FIG. 2A is a schematic diagram showing the configurations of the substrate and the matrix circuit in the manufacturing method of an opto-electronic apparatus according to the embodiment of the invention. Referring to FIG. 1A in view of FIG. 2A, the step S1 is to dispose a matrix circuit 12 above a substrate 11, wherein the matrix circuit 12 has a matrix circuit thickness Tm between a highest point of the matrix circuit 12 and a surface of the substrate 11. The substrate 11 can be a hard board or a flexible board (or soft board), and this embodiment is not limited. The matrix circuit 12 and the substrate 11 are together named as a matrix substrate. Based on the type of the circuit disposed on the substrate 11, the matrix substrate can be an active matrix substrate or a passive matrix substrate. For example, the matrix substrate applied to an LCD device can be configured with intersected data lines and scan lines.

Next, the step S2 is to dispose a plurality of first protrusions 13 above the substrate 11. The first protrusions 13 can be disposed on the surface of the substrate 11 or on the matrix circuit 12. At least one of the first protrusions 13 has a first protrusion thickness Tt1 between a highest point of the first protrusion 13 and the surface of the substrate 11, and the first protrusion thickness Tt1 is greater than the matrix circuit thickness Tm. The matrix circuit thickness Tm can be realized as the height of the matrix circuit 12, and the first protrusion thickness Tt1 can be realized as the height of the first protrusion 13. According to the above design, the first protrusions 13 can prevent the possible interference caused during the transfer step S3 for transferring the first opto-electronic units 14 (especially utilizing the reverse disposing method). Besides, the first protrusions 13 can also prevent the overflow of the gel when disposing the first opto-electronic units 14.

Figure 2B:
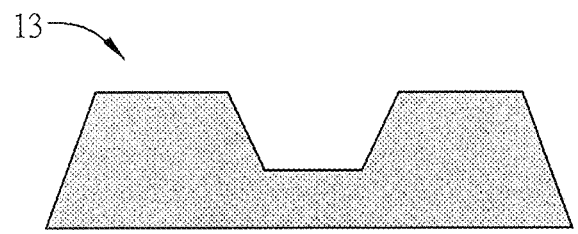
FIGS. 2B and 2C are schematic diagrams showing different aspects of the first protrusion in the manufacturing method of an opto-electronic apparatus according to the embodiment of the invention.
Figure 2C:
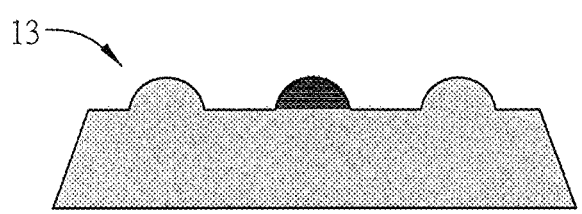

The first protrusions 13 can be made of metal or conductive material, or they can be composed of a combination of an insulation material and conductive wires. As shown in FIG. 2A, the top of the first protrusion 13 is configured with a conductive wire 131 for electrically connected with the matrix circuit 12. As shown in FIGS. 2B and 2C, the shape of the top of the first protrusion 13 can be irregular instead of a platform. As shown in FIG. 2B, the top of the first protrusion 13 is a concave portion; as shown in FIG. 2C, the top of the first protrusion 13 is configured with a plurality of bumps. The bumps or protrusions can be electrically connected to different electrodes of the first opto-electronic units 14.

The step S3 is to perform a transfer step for transferring a plurality of first opto-electronic units 14 from a first carrier C1 to the first protrusions 13 and bonding the first protrusions 13 to at least two of the first opto-electronic units 14 with an adhesive material 13a. The first opto-electronic unit 14 can be a device with three electrodes (e.g. a transistor) or with two electrodes such as, for example but not limited to, an LED, a photo diode or an image sensor. In this embodiment, the first opto-electronic unit 14 is an LED, which can be an LED die or a packaged LED chip. The p and n electrodes of the LED can be disposed at the same side, and the LED is bonded to the matrix substrate by flip-chip bonding. Alternatively, the p and n electrodes of the LED can be disposed at opposite sides. When the first opto-electronic unit 14 is an LED, it can be a blue LED, a red LED, a green LED, a white LED or their combinations. The first adhesive material 13a can be selected according to the bonding method. For example, when the first adhesive material 13a bonds the first protrusion 13 and the first opto-electronic unit 14 by light curing (e.g. UV light), the first adhesive material 13a is a UV curable gel. When the first adhesive material 13a is solidified by thermal curing, the first adhesive material 13a is a thermosetting adhesive material, such as the film type adhesive material (e.g. anisotropic conductive film (ACF)) or anisotropic conductive paste (ACP). The first adhesive material 13a is disposed between the LED and the first protrusion. The first adhesive material 13a can be disposed on the first protrusions by gel dispensing or pattern printing.

The first adhesive material 13a is preferably electrical conductive, such as the above mentioned ACF, ACP or a silver paste. In this case, the p and n electrodes of the first opto-electronic unit 14 are disposed at opposite sides, and one electrode of the first opto-electronic unit 14 is bonded to a first wire 131 on the first protrusion 13 by the first adhesive material 13a, thereby electrically connecting to the matrix circuit 12.

In order to firmly support the first opto-electronic unit 14 by the first protrusion 13, the top surface area of the first protrusion 13 is preferably greater than 50% of the area of the first opto-electronic unit 14 bonded to the first protrusion 13. In other words, the top surface area of the first protrusion 13, which bonded to the first opto-electronic unit 14 is over a half of the area of the first opto-electronic unit 14. Accordingly, most of the bottom surface of the first opto-electronic unit 14 is supported by the first protrusion 13 and is not suspended, so that the first opto-electronic unit 14 can be disposed more firmly. Thus, the first opto-electronic unit 14 will not be loosened from the substrate 11 by collision or shake in the following procedures (e.g. the procedure for disposing the planarization layer 15 as shown in FIG. 2F). To firmly dispose the first opto-electronic unit 14 can make the following procedures much easier. Preferably, the top surface area of the first protrusion 13 bonded to the first opto-electronic unit 14 is greater than or equal to the area of the first opto-electronic unit 14. For example, the size of the first opto-electronic unit 14 is 20 μm×20 μm, and the size of the first protrusion is 25 μm×25 μm, which is larger than the first opto-electronic unit 14.

Figure 1B:
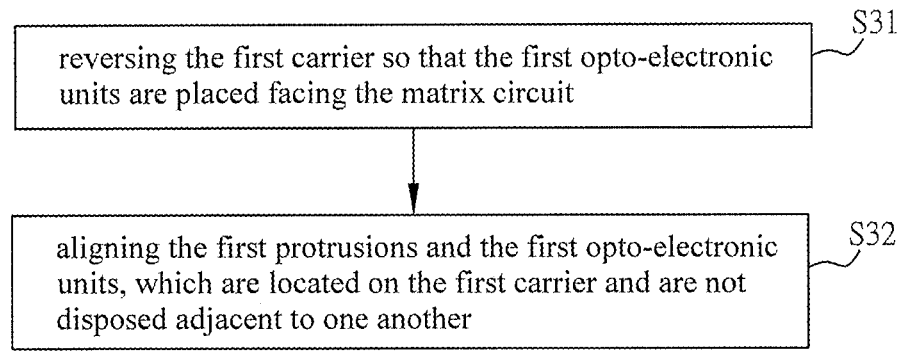
FIG. 1B is a flow chart showing a transfer step in the manufacturing method of an opto-electronic apparatus according to the embodiment of the invention.

In addition, the transfer step in the step S3 can be performed by, for example, a reverse method, a nano-tape transfer method or a polycrystalline-suction transfer method for transferring the first opto-electronic unit 14. In the embodiment, the transfer step is performed by a reverse method, but this invention is not limited thereto. FIG. 1B is a flow chart showing a transfer step in the manufacturing method of an opto-electronic apparatus according to the embodiment of the invention. Referring to FIG. 1B, the transfer step includes the steps of: reversing the first carrier so that the first opto-electronic units are placed facing the matrix circuit (step S31); and aligning the first protrusions and the first opto-electronic units, which are located on the first carrier and are not disposed adjacent to one another (step S32).

Figure 2D:
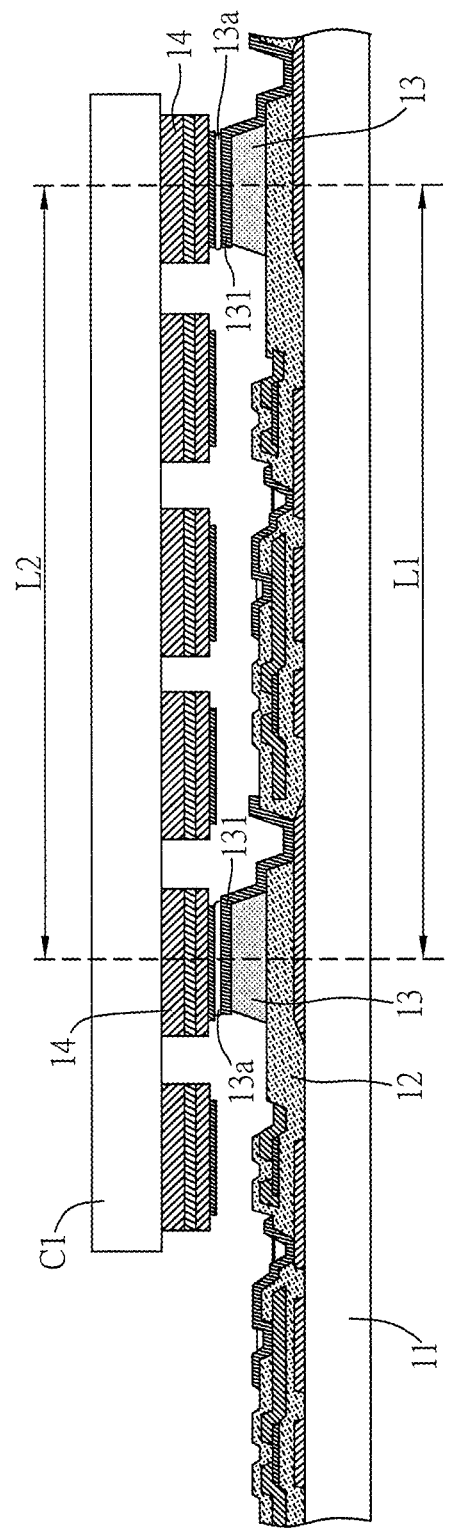
FIG. 2D is a schematic diagram showing the transfer procedure of the first opto-electronic unit in the manufacturing method of an opto-electronic apparatus according to the embodiment of the invention.
Figure 2E:
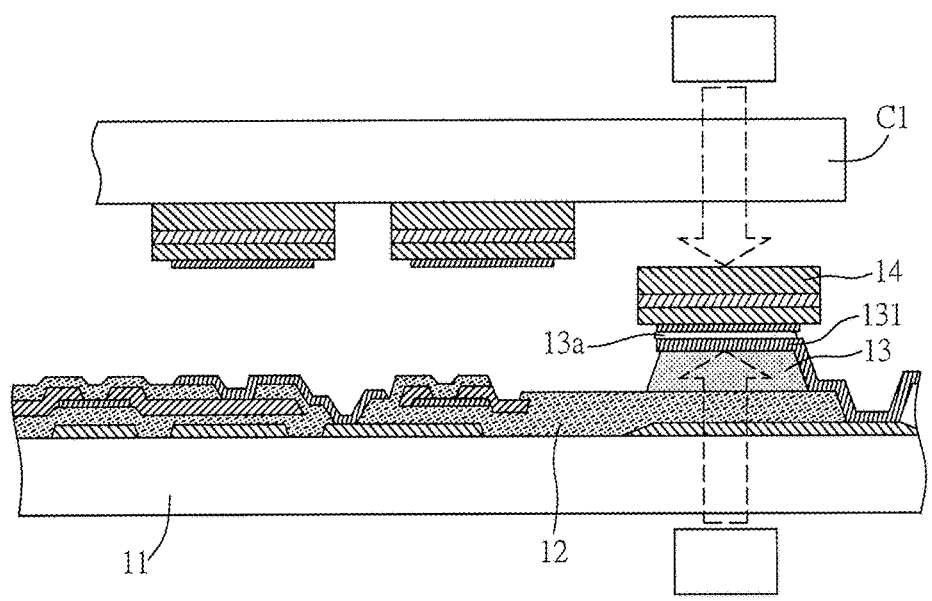
FIG. 2E is a schematic diagram showing the transfer procedure of the first opto-electronic unit by laser lift off in the manufacturing method of an opto-electronic apparatus according to the embodiment of the invention.
Figure 2F:
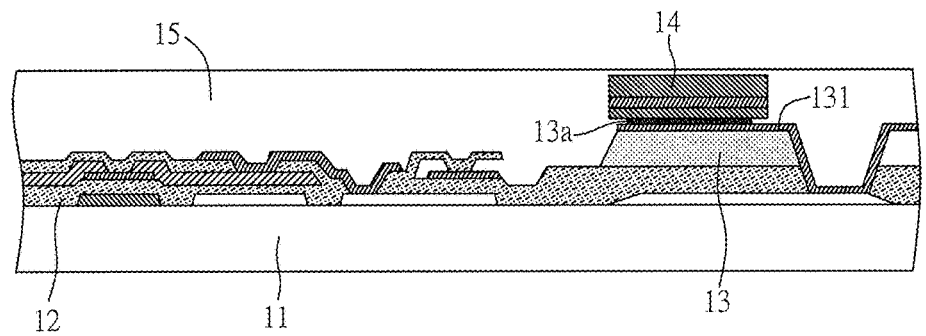
FIGS. 2F to 2H are schematic diagrams showing the step of disposing a planarization layer in the manufacturing method of an opto-electronic apparatus according to the embodiment of the invention.

Referring FIG. 2D, the step S31 is to reverse the first carrier C1, which carries a plurality of first opto-electronic units 14, so that the first opto-electronic units 14 are placed facing the matrix circuit 12 and the substrate 11. Next, the step S32 is to align the first protrusions 13 disposed on the matrix circuit 12 and the first opto-electronic units 14, which are located on the first carrier C1 and are not disposed adjacent to one another. Then, as shown in FIG. 2E, the first opto-electronic units 14 to be adhered to the first protrusions 13 are separated from the first carrier C1 by laser lift off. The first carrier C1 can be a crystalline substrate or any other carrier substrate such as a blue tape, and the selected and classified LEDs (the first opto-electronic units 14) are carried by the first carrier C1. As mentioned above, in order to avoid the interferences between the first opto-electronic units 14 and the components disposed on the matrix substrate and the glue overflow as disposing the first adhesive material 13a, the substrate 11 is configured with the first protrusions 13. Preferably, the pitch L1 between two adjacent first protrusions 13 on the substrate 11 is substantially equal to the pitch L2 between two first opto-electronic units 14, which are located on the first carrier C1 and are not disposed adjacent to one another.

Figure 1C:
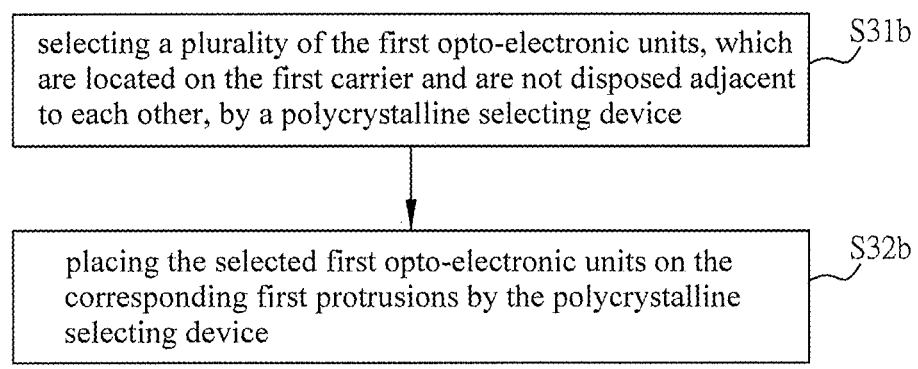
FIG. 1C is a flow chart showing another transfer step in the manufacturing method of an opto-electronic apparatus according to the embodiment of the invention.

In addition, the transfer step of the first opto-electronic units can be performed by polycrystalline transfer method. FIG. 1C is a flow chart showing another transfer step in the manufacturing method of an opto-electronic apparatus according to the embodiment of the invention. As shown in FIG. 1C, the transfer step includes the following steps of: selecting a plurality of the first opto-electronic units, which are located on the first carrier and are not disposed adjacent to each other, by a polycrystalline selecting device (step S31b); and placing the selected first opto-electronic units on the corresponding first protrusions by the polycrystalline selecting device (step S32b). In this aspect, the utilized machine may include a plurality of pick-up heads or a nano-tape with a hollow portion or a checker board pattern for selecting a plurality of opto-electronic units.

Figure 2G:
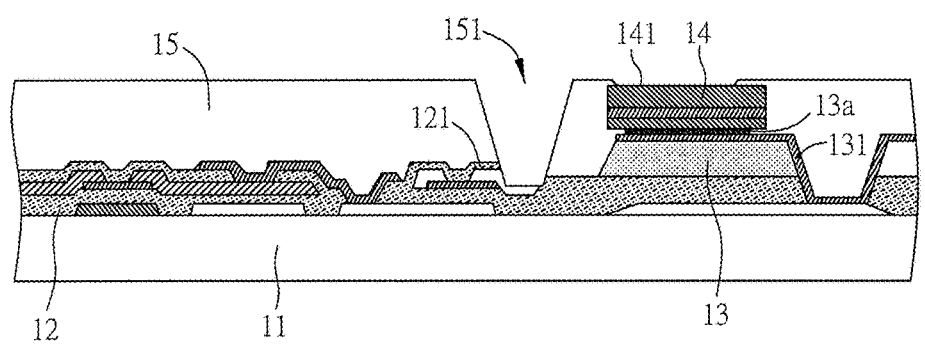
Figure 2H:
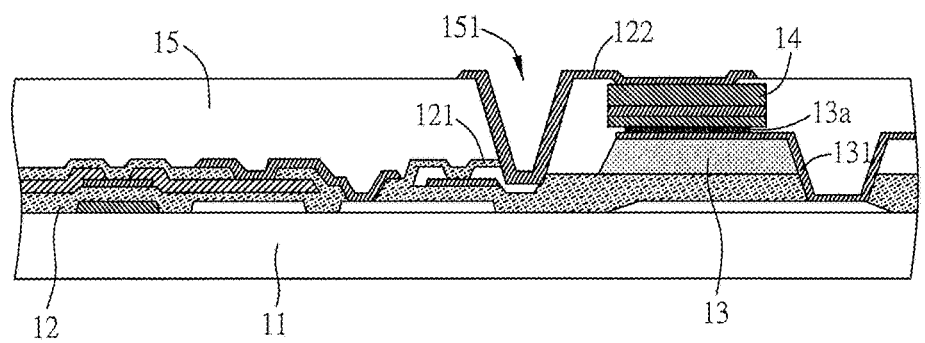

In this embodiment, the manufacturing method of an opto-electronic apparatus preferably further includes the following steps S41-S7 as shown in FIG. 1A. FIGS. 2F to 2H are schematic diagrams showing the step of disposing a planarization layer in the manufacturing method of an opto-electronic apparatus according to the embodiment of the invention. As shown in FIG. 2F, after transferring the first opto-electronic units in the step S3, the step S41 is to dispose a planarization layer 15 to cover the first protrusions 13 and at least a part of the first opto-electronic units 14 disposed on the substrate 11. Next, as shown in FIG. 2G the step S42 is to etch the planarization layer 15 to form at least one opening 151 for exposing a driving electrode 121 disposed in the matrix circuit 12. The driving electrode 121 is configured to drive the first opto-electronic units 14. After the etching step, as shown in FIG. 2H, the step S43 is to electrically connect the driving electrode 121 to a conductive portion 141 of each first opto-electronic unit 14 (the other electrode of the first opto-electronic unit 14) by the second wire 122.

Figure 2I:
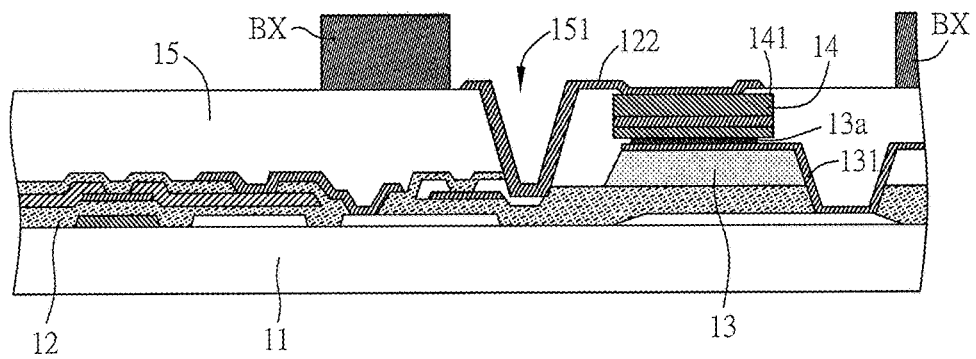
FIG. 2I is a schematic diagram showing the step of disposing a black frame layer in the manufacturing method of an opto-electronic apparatus according to the embodiment of the invention.
Figure 2J:
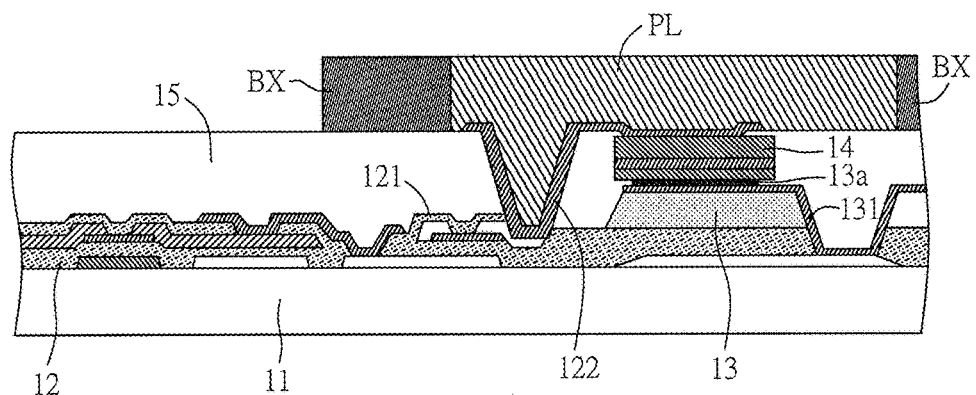
FIG. 2J is a schematic diagram showing the step of disposing a fluorescent layer in the manufacturing method of an opto-electronic apparatus according to the embodiment of the invention.
Figure 2K:
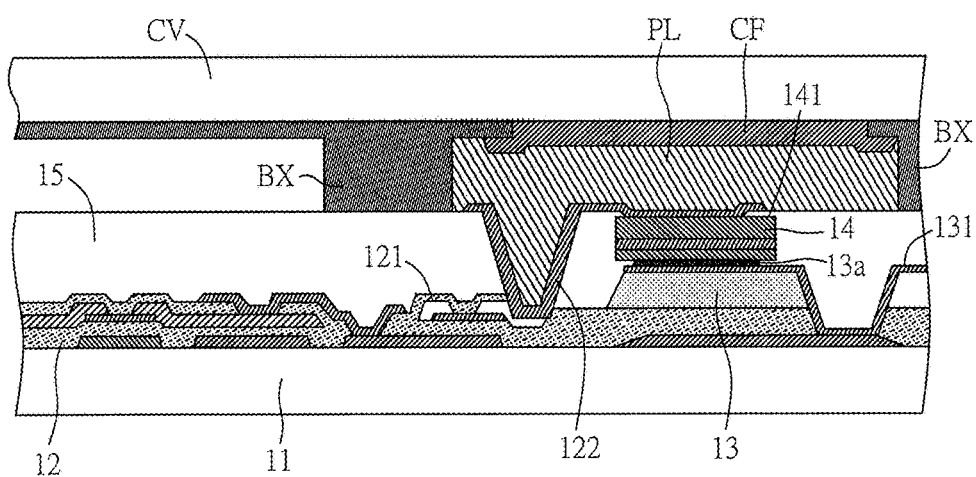
FIG. 2K is a schematic diagram showing the step of disposing a cover in the manufacturing method of an opto-electronic apparatus according to the embodiment of the invention.
Figure 2L:
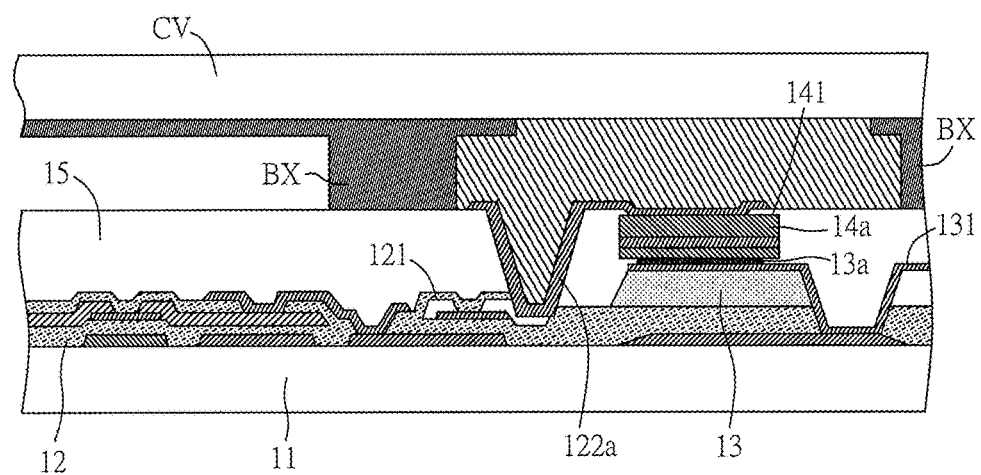
FIG. 2L is a schematic diagram showing an opto-electronic apparatus made of additional first opto-electronic units.

After disposing the planarization layer 15 and electrically connecting the driving electrode 121 to the conductive portion 141 of each first opto-electronic unit 14, the black frame layer BX, the fluorescent layer PL and the cover CV are sequentially disposed. As shown in FIG. 2I, the step S5 is to dispose at least one black frame layer BX on the planarization layer 15, wherein the black frame layer BX surrounds at least one of the first opto-electronic units 14. After disposing the black frame layer BX, as shown in FIG. 2J, the step S6 is to dispose at least one fluorescent layer PL on at least a part of the first opto-electronic units 14. As shown in FIG. 2J, the fluorescent layer PL is at least partially disposed in the area defined by the black frame layer BX surrounding the first opto-electronic units 14. Then, as shown in FIG. 2K, the step S7 is to dispose a cover CV corresponding to the substrate 11. The cover CV further includes a plurality of filter layers CF, which are disposed corresponding to the first opto-electronic units 14, respectively. The cover CV can be a color filter substrate of the conventional LCD device for achieving the full colorization of the opto-electronic apparatus 1. As shown in FIG. 2L, if it is unnecessary to change the display color of the first opto-electronic units 14a (e.g. the green display panel directly utilizes the green LED), the cover CV is also unnecessary to be configured with the color filter layer CF and is directly disposed on the fluorescent layer PL and the black frame layer BX. Similarly, one electrode of the first opto-electronic units 14a is bonded to the first wire 131 of the first protrusion 13 by the first adhesive material 13a so as to electrically connect to the matrix circuit 12, and the conductive portion 141a of the first opto-electronic units 14a (the other electrode of the first opto-electronic units 14) is electrically connected to the driving electrode 121 via the second wire 122a.

Figure 2M:
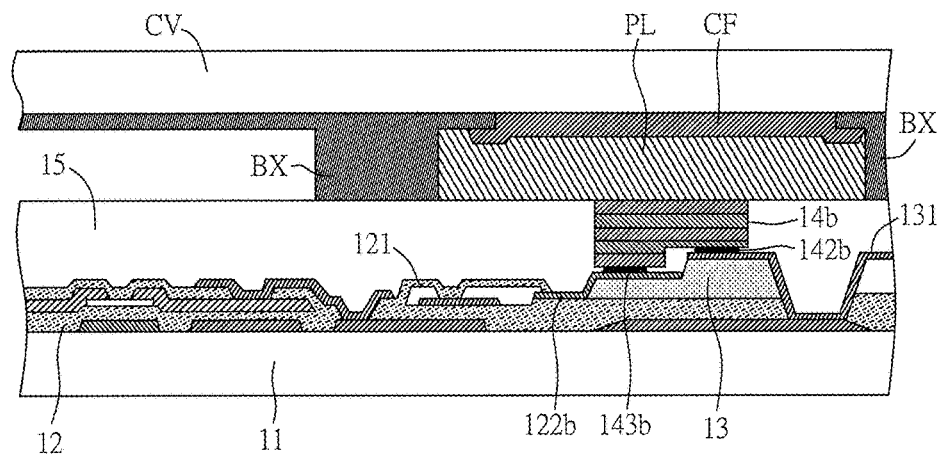
FIG. 2M is a schematic diagram showing an opto-electronic apparatus made of additional first opto-electronic units.
Figure 2N:
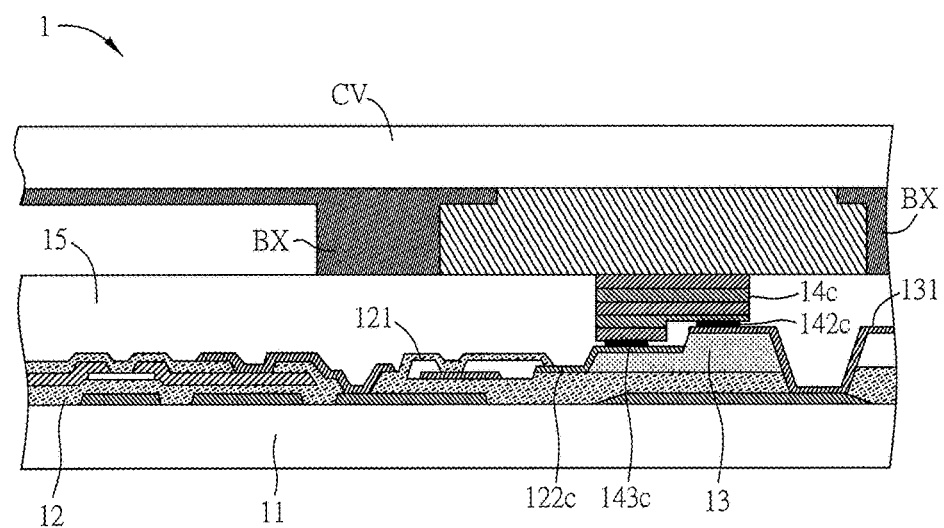
FIG. 2N is a schematic diagram showing an opto-electronic apparatus made of additional first opto-electronic units.

To be noted, the above mentioned first opto-electronic units 14 and 14a are vertical structural LEDs, which have p and n electrodes disposed at opposite sides. If the first opto-electronic units are horizontal structural LEDs, which have p and n electrodes disposed at the same side, the manufactured opto-electronic apparatus is shown as FIG. 2M or FIG. 2N. As shown in FIG. 2M, the first opto-electronic units 14b of the opto-electronic apparatus are horizontal structural LEDs. The first electrode 142b and the second electrode 143b are disposed at the same side of the first opto-electronic unit 14b facing the first protrusion 13, and they are bonded to the first protrusion 13 by an adhesive material (not shown). The first electrode 142b is electrically connected to the matrix circuit 12 via the first wire 131, and the second electrode 143b is electrically connected to the driving electrode 121 of the matrix circuit 12 via the second wire 122b. The opto-electronic apparatus of FIG. 2M is similar to the opto-electronic apparatus of FIG. 2K, so it needs to change the display color of the first opto-electronic units 14b. Accordingly, the cover CV is configured with a filter layer CF and is disposed on the fluorescent layer PL and the black frame layer BX for changing the display color of the first opto-electronic units 14b, thereby achieving the full colorization of the opto-electronic apparatus 1. Similar to the opto-electronic apparatus of FIG. 2M, the first opto-electronic units 14c of the opto-electronic apparatus 1 of FIG. 2N are also horizontal structural LEDs, each of which has a first electrode 142c and a second electrode 143c disposed at the same side of the first opto-electronic unit 14c facing the first protrusion 13. The first electrode 142c and the second electrode 143c are bonded to the first protrusion 13 by an adhesive material (not shown). The first electrode 142c is electrically connected to the matrix circuit 12 via the first wire 131, and the second electrode 143c is electrically connected to the driving electrode 121 of the matrix circuit 12 via the second wire 122c. Different from the opto-electronic apparatus of FIG. 2M, the opto-electronic apparatus of FIG. 2N does not need to change the display color of the first opto-electronic units 14c. Accordingly, the cover CV is configured without a filter layer CF and is directly disposed on the fluorescent layer PL and the black frame layer BX.

Figure 6:
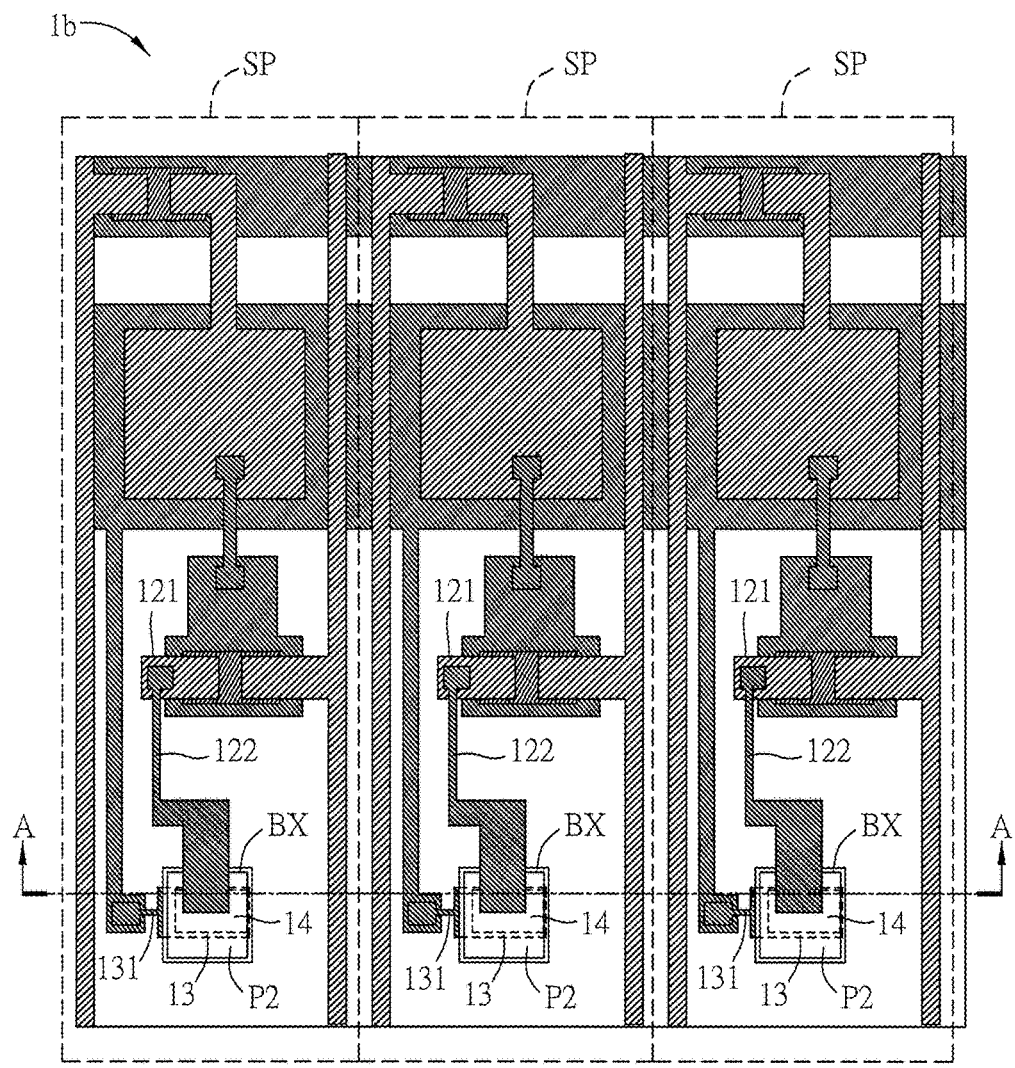
FIG. 6 is a top view of the manufactured opto-electronic apparatus according to the embodiment of the invention.

FIG. 6 is a top view of the opto-electronic apparatus manufactured by the manufacturing method according to the embodiment of the invention, wherein, the cover of the opto-electronic apparatus is not shown. As shown in FIG. 6, the opto-electronic apparatus 1 is configured with the matrix circuit 12. To be noted, each dotted line block indicates a sub-pixel area SP. For example, three sub-pixels are configured with blue LEDs, and the filter layer with corresponding colors is configured for forming the desired RGB pixels, thereby achieving the full colorization of the opto-electronic apparatus. As shown in FIG. 6, each sub-pixel area SP includes a first protrusion 13, a first opto-electronic unit 14 (an LED), a black frame layer BX, and a fluorescent layer PL as well as a driving electrode 121, a first adhesive material 13a (not shown) and a first wire 131 (not shown), which are configured for controlling the first opto-electronic unit 14 to electrically connect with the matrix circuit 12. For easily manufacturing, the filter layer CF corresponding to each sub-pixel covers the range of the sub-pixel area SP in the dotted block, and the filter layer CF is not limited to the size of the corresponding black frame layer BX. In this embodiment, the range defined by each black frame layer BX surrounding the first opto-electronic unit 14 is preferably smaller than the area covered by the filter layer CF.

In the above embodiment, the first opto-electronic units 14 of the opto-electronic apparatus 1 are all the same (e.g. a blue LED). If the filter layers CF of the cover are with the same color, the manufactured opto-electronic apparatus 1 can be a monochrome display panel. To fabricate the opto-electronic apparatus 1 with multiple colors, the cover can be configured with the filter layers CF with different colors. If the opto-electronic apparatus 1 is a full color display device, the filter layers CF in each sub-pixel area should include three different colors, such as red, green and blue. Alternatively, the substrate may be configured with opto-electronic units of different wavelengths (emitting different color lights). Accordingly, it is necessary to configure the first and second protrusions for different opto-electronic units. The configuration will be described hereinafter.

Figure 3:
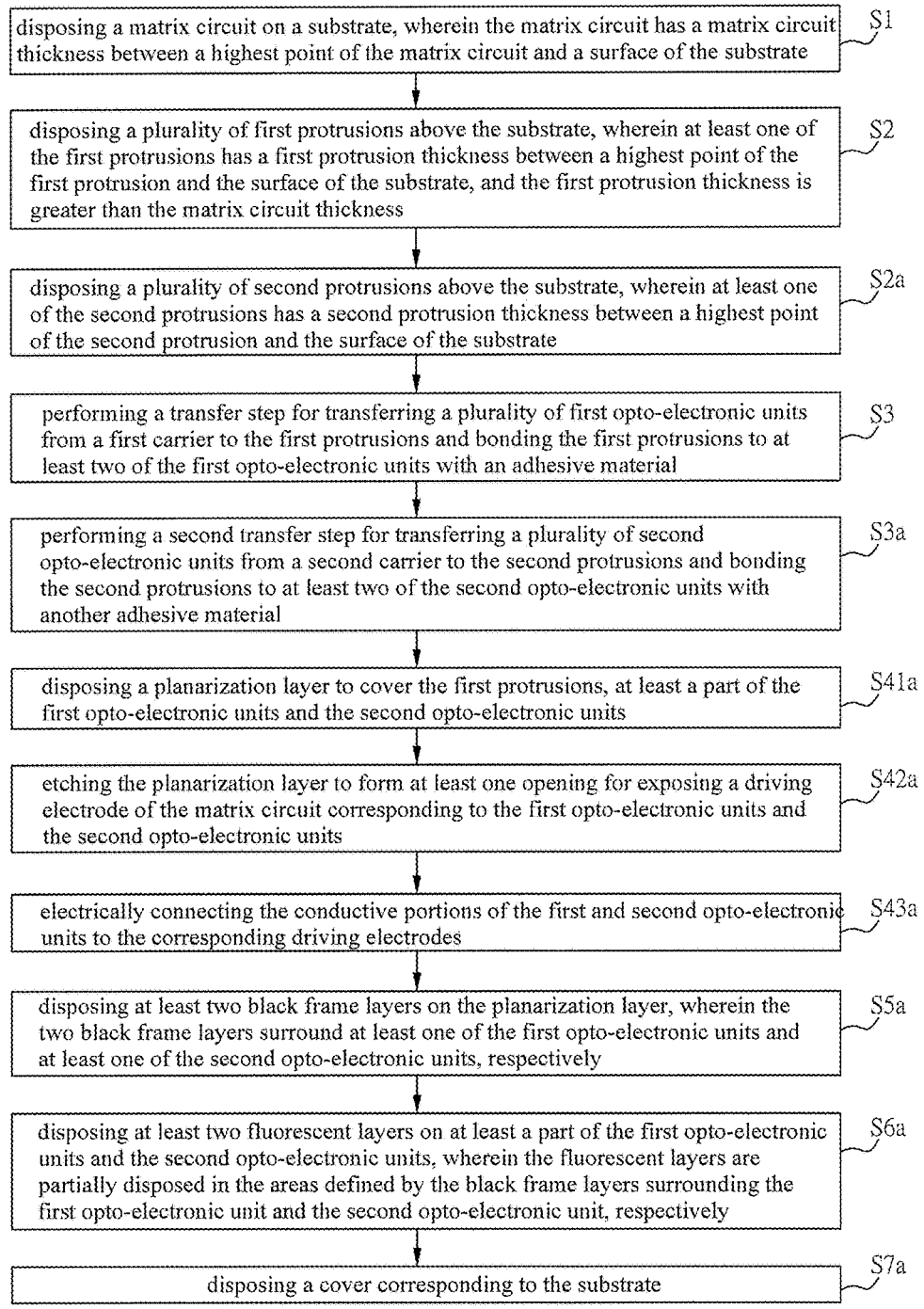
FIG. 3 is a flow chart of a manufacturing method of an opto-electronic apparatus according to another embodiment of the invention.
Figure 4A:
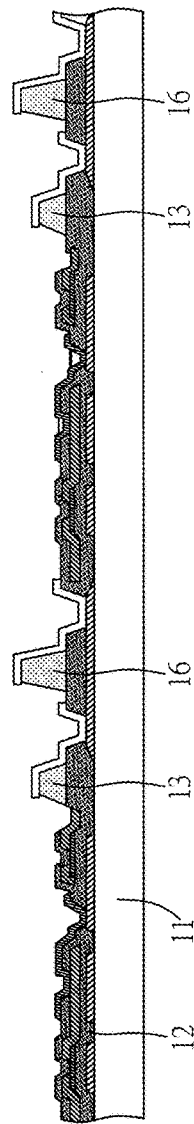
FIG. 4A is a schematic diagram showing the configuration of second protrusions in the manufacturing method of an opto-electronic apparatus according to the another embodiment of the invention.

FIG. 3 is a flow chart of a manufacturing method of an opto-electronic apparatus 1a according to another embodiment of the invention. Referring to FIGS. 3 and 4A to 4C, the step S1 is to dispose a matrix circuit 12 above a substrate 11, and the step S2 is to dispose a plurality of first protrusions 13 above the substrate 11. Next, as shown in FIG. 4A, the step S2a is to dispose a plurality of second protrusions 16 above the substrate 11, wherein at least one of the second protrusions 16 has a second protrusion thickness Tt2 between a highest point of the second protrusion 16 and the surface of the substrate 11. Each of the second protrusions 16 is electrically connected to the matrix circuit 12. In this step, the second protrusion thickness Tt2 is greater than the first protrusion thickness Tt1. The highest point of the second protrusion 16 is greater than the highest point of the first protrusion 13 and is lower the sum of the first protrusion 13 and the thickness of the first opto-electronic unit 14. Preferably, each second protrusion thickness Tt2 is greater than any first protrusion thickness Tt1.

Figure 4B:
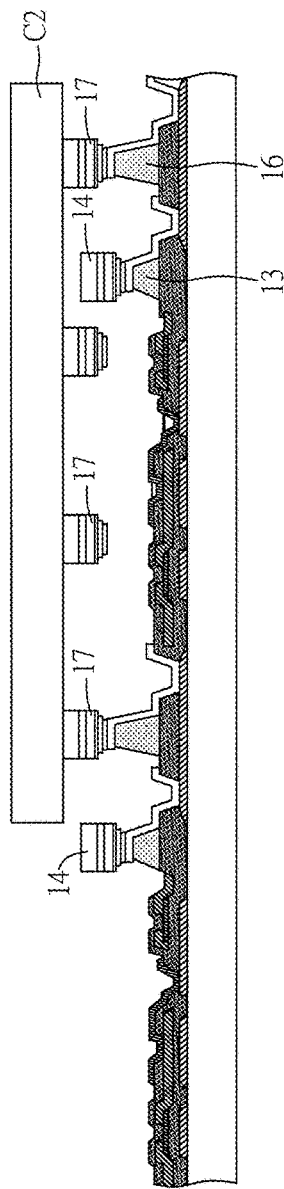
FIG. 4B is a schematic diagram showing the transfer procedure of the second opto-electronic units in the manufacturing method of an opto-electronic apparatus according to the another embodiment of the invention.
Figure 4C:
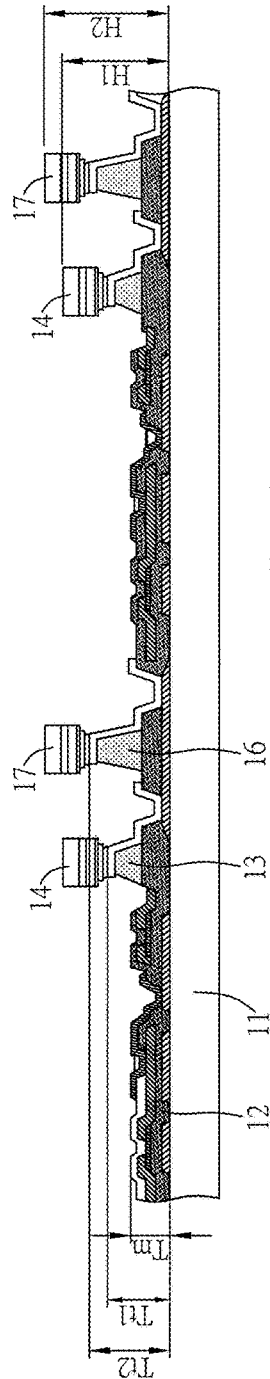
FIG. 4C is a schematic diagram showing the transferred second opto-electronic units in the manufacturing method of an opto-electronic apparatus according to the another embodiment of the invention.

After disposing the second protrusions 16 on the substrate 11, a transfer step for transferring a plurality of first opto-electronic units 14 (step S3) is performed. After transferring the first opto-electronic units 14 and disposing them on the first protrusions 13 (steps S3, S31 and S32), the step S3a is performed. As shown in FIGS. 4B and 4C, another transfer step is performed for transferring the second opto-electronic units 17 from a second carrier C2 to the second protrusions 16 and bonding the second protrusions 16 to at least two of the second opto-electronic units 17 with an adhesive material 17a. Similar to the disposing method of the first opto-electronic units 14, the transfer step for transferring the second opto-electronic units 17 can be performed by, for example, a reverse method, a nano-tape transfer method or a polycrystalline-suction transfer method. If the transfer step is performed by a reverse method, the procedures of the transfer step can be referred to the steps S31 and S32 of the above embodiment. If the transfer step is performed by a polycrystalline-suction transfer method, the procedures of the transfer step can be referred to the steps S31b and S32b of the above embodiment. Thus, the detailed descriptions thereof will be omitted. In addition, the material of the second adhesive material 17a can be the same as the above first adhesive material 13a such as tin, ACF, ACP or silver paste. Accordingly, the second opto-electronic units 17 can be bonded to the second wires 161 of the second protrusion 16 by the second adhesive material 17a so as to electrically connect to the matrix circuit 12 via the second wire 161. After the above transfer steps, the opto-electronic apparatus is manufactured as shown in FIG. 4C. Preferably, a sum H2 of the second protrusion thickness Tt2 and a thickness of the corresponding second opto-electronic unit 17 is greater than a sum H1 of the first protrusion thickness Tt1 and a thickness of the corresponding first opto-electronic unit 14.

After disposing the first opto-electronic units 14 and the second opto-electronic units 17 to the corresponding first protrusions 13 and the corresponding second protrusions 16 and electrically connecting the first opto-electronic units 14 and the second opto-electronic units 17 to the matrix circuit 12, the steps S41 to S7 as described in the previous embodiment are performed. Thus, the detailed descriptions thereof will be omitted. To be noted, the manufacturing method of the opto-electronic apparatus 1a is to configure opto-electronic units with different light wavelengths for achieving the full colorization. Thus, it is possible to configure the same filter layers on the opto-electronic units. In this case, the filter layers is configured to modify the color of the light emitted from the opto-electronic units or make the outputted light more uniform.

To make the invention more comprehensive, the following description discloses the manufacturing method of an opto-electronic apparatus, which is a full color LED display panel with reference to FIGS. 5A to 5H.

Figure 5A:
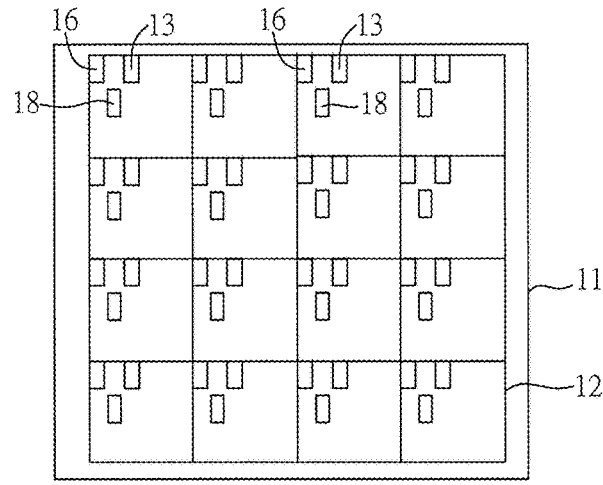
FIGS. 5A to 5H are schematic diagrams showing the procedures for transferring the opto-electronic units onto the substrate in the manufacturing method of an opto-electronic apparatus according to the embodiment of the invention.
Figure 5B:
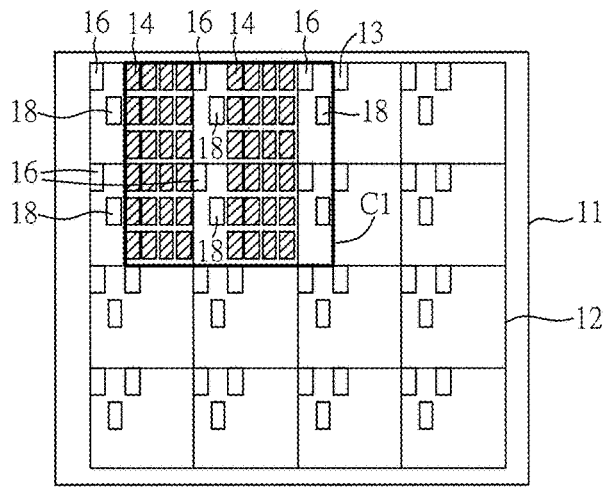
Figure 5C:
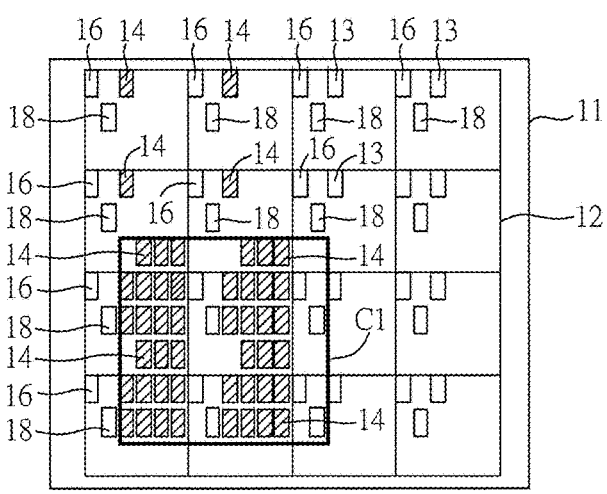

FIGS. 5A to 5H are schematic diagrams showing the procedures for transferring the opto-electronic units onto the substrate in the manufacturing method of an opto-electronic apparatus according to the embodiment of the invention. As shown in FIG. 5A, the substrate 11 is configured with a matrix circuit (referring to FIG. 2A), first protrusions 13, second protrusions 16 and third protrusions 18. In addition, the step S3 of the previous embodiment has been performed. In FIG. 5A, each block refers to a pixel area P, which includes a first protrusion 13, a second protrusion 16 and a third protrusion 18. To be noted, the positions of the first protrusion 13, second protrusion 16 and third protrusion 18 in the pixel area are not limited. For example, the first protrusion 13, second protrusion 16 and third protrusion 18 can be centralized at one corner or be uniformly distributed in the pixel area. The aspect as shown in FIG. 5A is for an illustration only and is not to limit the invention. As shown in FIGS. 5B and 5C, the transfer step is performed to transfer the first opto-electronic units. The detailed procedure of the transfer step can be referred to the steps S3, S31 and S32 of the previous embodiment, so the descriptions thereof will be omitted. As shown in the figures, the first carrier C1 (the block with thicker borders) supports a plurality of first opto-electronic units 14, and the first opto-electronic units 14 are transferred to the corresponding first protrusions 13 by a reverse method. In the transfer procedure, the first carrier C1 is moved from the top to the bottom and then moved from the left to the right. At the same time, the selected first opto-electronic unit 14 (LED) is adhered to the corresponding first protrusion 13, and the residual first opto-electronic units 14 are moved along with the first carrier C1 to another area for a next transfer step (including a step of laser lift off). As shown in the figures, the area corresponding to the first carrier C1 is over a display pixel. In this case, the area corresponding to the first carrier C1 covers 4 display pixels, so that each transfer step can transfer 4 first opto-electronic units 14 to the corresponding first protrusions 14. This configuration can further reduce the manufacturing time. As mentioned above, the first protrusion 13 has a first protrusion thickness Tt1 between a highest point of the first protrusion 13 and the surface of the substrate 11, and the first protrusion thickness Tt1 is greater than the matrix circuit thickness Tm (see FIG. 2A). Accordingly, in the transfer procedure, the damaged components caused by the collisions and interferences between the opto-electronic units 14 on the carrier C1 and the matrix circuit 12 can be decreased.

Figure 5D:
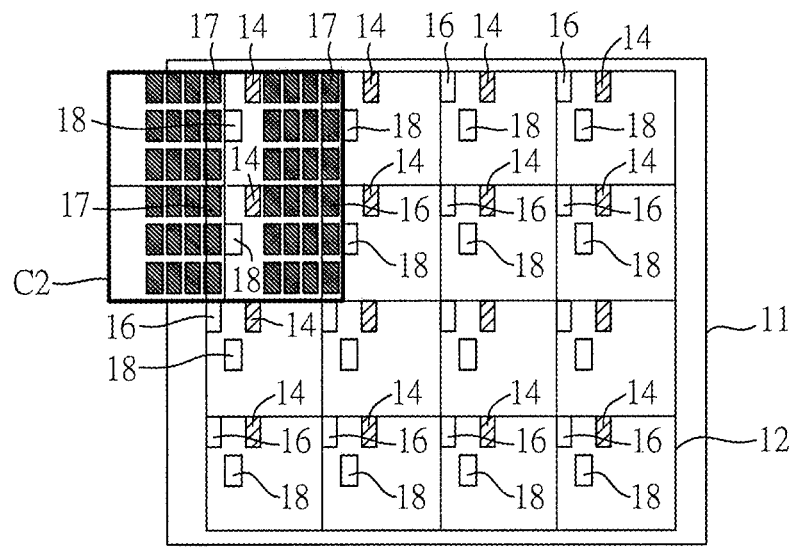
Figure 5E:
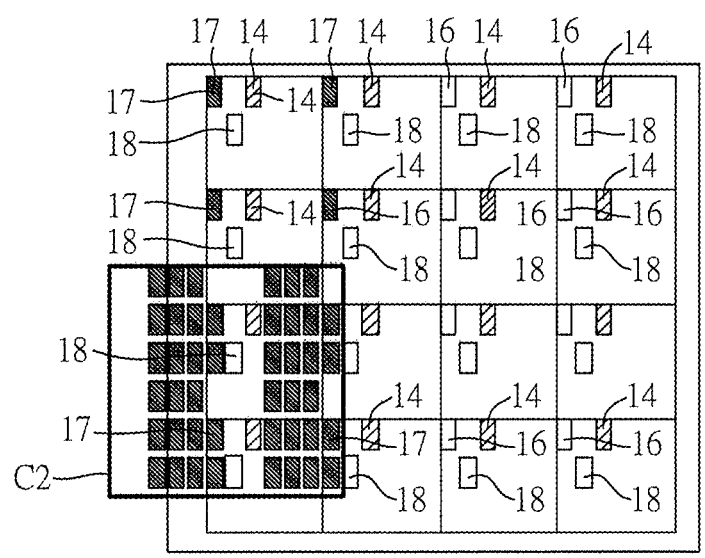

After disposing the first opto-electronic units 14, the next transfer step for transferring the second opto-electronic units 17 is performed. As shown in FIGS. 5D and 5E, the transfer step is performed to transfer the second opto-electronic units 17. The detailed procedure of the transfer step can be referred to the step S3a of the previous embodiment, so the descriptions thereof will be omitted. As shown in the figures, the second carrier C2 supports a plurality of second opto-electronic units 17, and the second opto-electronic units 17 are transferred to the corresponding second protrusions 16 by a reverse method. In the transfer procedure, the second carrier C2 is moved from the top to the bottom and then moved from the left to the right. In this case, the area corresponding to the second carrier C2 also covers 4 display pixels, so that each transfer step can transfer 4 second opto-electronic units 17 to the corresponding second protrusions 16. As mentioned above, the second protrusion thickness Tt2 is greater than the first protrusion thickness Tt1, and the highest point of the second protrusion 16 is greater than the highest point of the first protrusion 13 and is lower the sum of the first protrusion 13 and the thickness of the first opto-electronic unit 14. In addition, a sum H2 of the second protrusion thickness Tt2 and a thickness of the corresponding second opto-electronic unit 17 is greater than a sum H1 of the first protrusion thickness Tt1 and a thickness of the corresponding first opto-electronic unit 14 (see FIG. 4A). Preferably, a column of the second carrier C2 corresponding to the first protrusions 13, which have been disposed with the first opto-electronic units 14, and a column of the second carrier C2 corresponding to the third protrusions 18, which are not disposed with the third opto-electronic units 19 yet, do not carry the second opto-electronic units 17. Accordingly to the above configurations, the damages of the components caused by the collisions and interferences between the second opto-electronic units 17 on the second carrier C2, the matrix circuit 12, the disposed first opto-electronic units 14, and other components on the substrate 11 can be decreased during the transfer procedure.

Figure 5F:
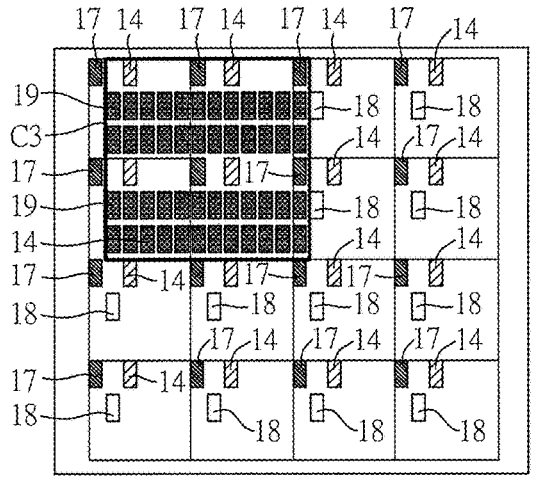
Figure 5G:
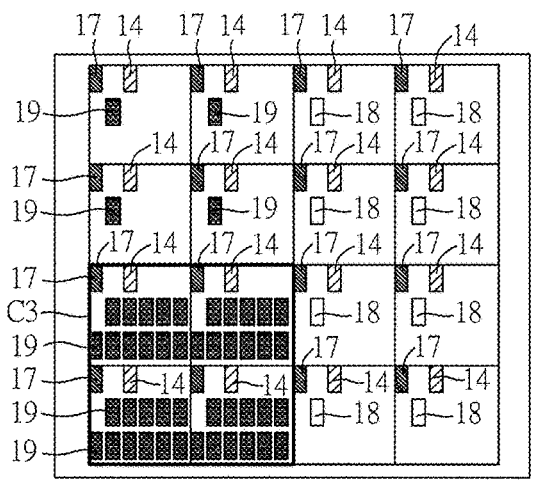
Figure 5H:
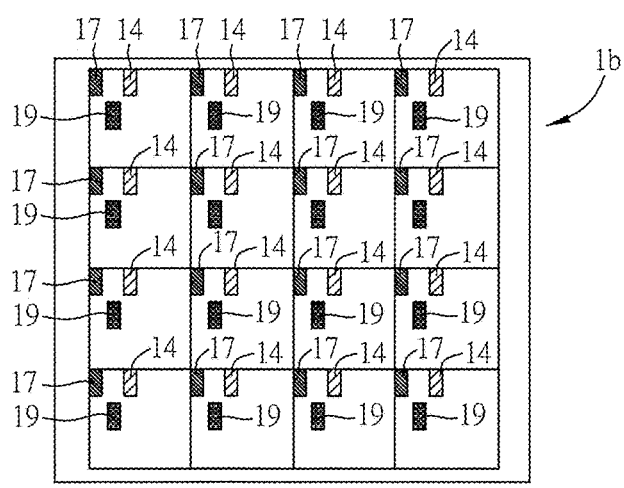

Similarly, after disposing the second opto-electronic units 17, the next transfer step for transferring the third opto-electronic units 19 is performed. As shown in FIGS. 5F and 5G the transfer step is performed to transfer the third opto-electronic units 19. The detailed procedure of the transfer step can be referred to the step S3a of the previous embodiment, so the descriptions thereof will be omitted. As shown in the figures, the third carrier C3 supports a plurality of third opto-electronic units 19, and the third opto-electronic units 19 are transferred to the corresponding third protrusions 18 by a reverse method. In the transfer procedure, the third carrier C3 is moved from the top to the bottom and then moved from the left to the right. In this case, the area corresponding to the third carrier C3 also covers 4 display pixels, so that each transfer step can transfer 4 third opto-electronic units 19 to the corresponding third protrusions 18. As mentioned above, a third protrusion thickness between the highest point of the third protrusion 18 and the surface of the substrate 11 is greater than the matrix circuit thickness (see FIG. 2A). Preferably, a row of the third carrier C3 corresponding to the first protrusions 13 and the first opto-electronic units 14 and a row of the third carrier C3 corresponding to the second protrusions 16 and the second opto-electronic units 17 do not carry the third opto-electronic units 19. Accordingly to the above configurations, the damages of the components caused by the collisions and interferences between the third opto-electronic units 19 on the third carrier C3, the matrix circuit 12, the disposed first opto-electronic units 14, the disposed second opto-electronic units 17, and other components on the substrate 11 can be decreased during the transfer procedure. Besides, the gel overflow issue during the transfer procedure of the third opto-electronic units 19 can also be reduced. FIG. 5H is a top view of the opto-electronic apparatus 1b configured with the first opto-electronic units 14, the second opto-electronic units 17 and the third opto-electronic units 19.

In addition, the invention also discloses an opto-electronic apparatus, which is fabricated by the above-mentioned manufacturing method. The structure of the opto-electronic apparatus will be described hereinafter, and the connections and modifications of the components in the opto-electronic apparatus can be referred to the above descriptions of the manufacturing method. FIG. 6 shows the structure of the opto-electronic apparatus 1b, and FIG. 2K is a sectional view of the opto-electronic apparatus 1b of FIG. 6 along the line A-A. Referring to FIGS. 2K and 6, the opto-electronic apparatus 1b includes a substrate 11, a matrix circuit 12, a plurality of first protrusions 13, and a plurality of first opto-electronic units 14. The matrix circuit 12 is disposed on the substrate 11, and the first protrusions 13 are disposed above the matrix circuit 12. The matrix circuit 12 has a matrix circuit thickness Tm between a highest point of the matrix circuit 12 and a surface of the substrate 11. The first opto-electronic units 14 are bonded to the first protrusions 13 by a first adhesive material 13a. The first adhesive material 13a is electric conductive, and the first opto-electronic unit 14 is electrically connected to the matrix circuit 12 via the first adhesive material 13a. The first adhesive material 13a can be tin, ACF, ACP or silver paste. In addition, each opto-electronic unit 14 can be connected to a conductive wire 131 of the first protrusion 13 via the first adhesive material 13a, and electrically connected to the matrix circuit 12 via the conductive wire 131. At least one of the first protrusions 13 has a first protrusion thickness Tt1 between a highest point of the first protrusion 13 and the surface of the substrate 11, and the first protrusion thickness Tt1 is greater than the matrix circuit thickness Tm.

In addition, the opto-electronic apparatus 1b further includes a planarization layer 15 covering the first protrusions 13 and at least a part of the first opto-electronic units 14. The planarization layer 15 has at least one opening 151 for exposing a driving electrode 121 disposed in the matrix circuit 12, and a conductive portion 141 of each first opto-electronic unit 14 is electrically connected to the driving electrode 121. Preferably, the conductive portion 141 of the first opto-electronic unit 14 and the driving electrode 121 of the matrix circuit 12 are both exposed from the opening 151 of the planarization layer 15.

Moreover, the opto-electronic apparatus 1b further includes at least one black frame layer BX, at least one fluorescent layer PL, and a cover CV. The black frame layer BX is disposed on the planarization layer 15 and surrounds at least one of the first opto-electronic units 14. The fluorescent layer PL is disposed on at least a part of the first opto-electronic units 14. The fluorescent layer PL is disposed in the area defined by the black frame layer BX surrounding the first opto-electronic units 14. The cover CV is disposed corresponding to the substrate 11. The cover CV further includes a plurality of filter layers CF, which are disposed corresponding to the first opto-electronic units 14, respectively.

As shown in FIG. 4C, the opto-electronic apparatus 1b further includes a plurality of second protrusions 16 and a plurality of opto-electronic units 17. The second protrusions 16 are disposed above the substrate 11, and at least one of the second protrusions 16 has a second protrusion thickness Tt2 between a highest point of the second protrusion 16 and the surface of the substrate 11. The second opto-electronic units 17 are bonded to the second protrusions 16 by another adhesive material 17a. In this case, a sum H2 of the second protrusion thickness Tt2 and a thickness of the corresponding second opto-electronic unit 17 is greater than a sum H1 of the first protrusion thickness Tt1 and a thickness of the corresponding first opto-electronic unit 14. Preferably, each second protrusion thickness Tt2 is greater than any first protrusion thickness Tt1. The first opto-electronic unit 14 or the second opto-electronic unit 17 can be a device with three electrodes (e.g. a transistor) or with two electrodes such as, for example but not limited to, an LED, a photo diode or a photo diode. In this embodiment, the first opto-electronic unit 14 and the second opto-electronic unit 17 are LEDs for example. Preferably, the first protrusions 13 above the substrate 11 form a 2D array, and the second protrusions 16 above the substrate 11 also form another 2D array.

In order to firmly support the first opto-electronic unit 14 by the first protrusion 13, the top surface area of the first protrusion 13 is preferably greater than 50% of the area of the first opto-electronic unit 14 bonded to the first protrusion 13. In other words, the top surface area of the first protrusion 13, which bonded to the first opto-electronic unit 14 is over a half of the area of the first opto-electronic unit 14. Accordingly, most of the bottom surface of the first opto-electronic unit 14 is supported by the first protrusion 13 and is not suspended, so that the first opto-electronic unit 14 can be disposed more firmly. Thus, the first opto-electronic unit 14 will not be loosened from the substrate 11 by collision or shake in the following procedures (e.g. the procedure for disposing the planarization layer 15 as shown in FIG. 2F). To firmly dispose the first opto-electronic unit 14 can make the following procedures much easier. Preferably, the top surface area of the first protrusion 13 bonded to the first opto-electronic unit 14 is greater than the area of the first opto-electronic unit 14. For example, the size of the first opto-electronic unit 14 is 20 μm×20 μm, and the size of the first protrusion is 25 μm×25 μm, which is larger than the first opto-electronic unit 14.

In summary, the opto-electronic apparatus and manufacturing method thereof of the invention configure the protrusions on the substrate with a height design corresponding to other components, so that the collisions and interferences between the opto-electronic units and other components disposed on the substrate can be avoided during the transfer step of the opto-electronic units. Thus, the damages of the components due to the undesired collisions and interferences can be reduced. Accordingly, the manufacturing time can be shortened, the manufacturing yield can be improved, and the manufacturing cost can be decreased.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A manufacturing method of an opto-electronic apparatus, comprising steps of:
    disposing a matrix circuit on a substrate, wherein the matrix circuit has a matrix circuit thickness between a highest point of the matrix circuit and a surface of the substrate;
    disposing a plurality of first protrusions above the substrate, wherein at least one of the first protrusions has a first protrusion thickness between a highest point of the first protrusion and the surface of the substrate, and the first protrusion thickness is greater than the matrix circuit thickness; and
    performing a transfer step for transferring a plurality of first opto-electronic units from a first carrier to the first protrusions and bonding the first protrusions to at least two of the first opto-electronic units with an adhesive material,
    wherein each of the plurality of first protrusion has a top surface area, which is neater than 50% of a bottom surface area of each of the plurality of first opto-electronic unit.

2. The manufacturing method of claim 1, wherein the transfer step further comprises:
    reversing the first carrier so that the first opto-electronic units are placed facing the matrix circuit; and
    aligning the first protrusions and the first opto-electronic units, which are located on the first carrier and are not disposed adjacent to one another.

3. The manufacturing method of claim 2, wherein a pitch between two of the first opto-electronic units, which are located on the first carrier and are not disposed adjacent to one another, is equal to a pitch between two of the first protrusions, which are located on the substrate and are disposed adjacent to one another.

4. The manufacturing method of claim 1, wherein the transfer step further comprises:
    selecting a plurality of the first opto-electronic units, which are located on the first carrier and are not disposed adjacent to each other, by a polycrystalline selecting device; and
    placing the selected first opto-electronic units on the corresponding first protrusions by the polycrystalline selecting device.

5. The manufacturing method of claim 1, further comprising steps of:

disposing a planarization layer to cover the first protrusions and at least a part of the first opto-electronic units;

etching the planarization layer to form at least one opening for exposing a driving electrode disposed in the matrix circuit; and electrically connecting the driving electrode to a conductive portion of each of the first opto-electronic units.

6. The manufacturing method of claim 1, further comprising a step of:

disposing a plurality of second protrusions above the substrate, wherein at least one of the second protrusions has a second protrusion thickness between a highest point of the second protrusion and the surface of the substrate.

7. A manufacturing method of claim 6, wherein the second protrusion thickness is greater than the first protrusion thickness.

8. The manufacturing method of claim 7, further comprising a step of:

performing a second transfer step for transferring a plurality of second opto-electronic units from a second carrier to the second protrusions and bonding the second protrusions to at least two of the second opto-electronic units with another adhesive material.

9. The manufacturing method of claim 8, wherein a sum of the second protrusion thickness and a thickness of the second opto-electronic unit is greater than a sum of the first protrusion thickness and a thickness of the first opto-electronic unit.

10. The opto-electronic apparatus, comprising:

a substrate;

a matrix circuit disposed on the substrate, wherein the matrix circuit has a matrix circuit thickness between a highest point of the matrix circuit and a surface of the substrate;

a plurality of first protrusions disposed above the substrate; and a plurality of first opto-electronic units bonded to the first protrusions by an adhesive material;

wherein at least one of the first protrusions has a first protrusion thickness between a highest point of the first protrusion and the surface of the substrate, and the first protrusion thickness is greater than the matrix circuit thickness, wherein each of the plurality of first protrusion has a top surface area, which is greater than 50% of a bottom surface area of each of the plurality of first opto-electronic unit.

11. The opto-electronic apparatus of claim 10, wherein the adhesive material is electrical conductive, and the first opto-electronic units are electrically connected to the matrix circuit by the adhesive material.

12. The opto-electronic apparatus of claim 10, further comprising:

a planarization layer covering the first protrusions and at least a part of the first opto-electronic units, wherein the planarization layer has at least one opening for exposing a driving electrode disposed in the matrix circuit, and a conductive portion of each of the first opto-electronic units is electrically connected to the driving electrode.

13. The opto-electronic apparatus of claim 12, further comprising:

at least a black frame layer disposed on the planarization layer and surrounding at least one of the first opto-electronic units.

14. The opto-electronic apparatus of claim 10, further comprising:

at least a fluorescent layer disposed on at least a part of the first opto-electronic units.

15. The opto-electronic apparatus of claim 10, further comprising:

a cover disposed corresponding to the substrate.

16. The opto-electronic apparatus of claim 15, wherein the cover further has a plurality of filter layers disposed corresponding to the first opto-electronic units.

17. The opto-electronic apparatus of claim 10, further comprising:

a plurality of second protrusions disposed above the substrate, wherein at least one of the second protrusions has a second protrusion thickness between a highest point of the second protrusion and the surface of the substrate; and a plurality of second opto-electronic units bonded to the second protrusions by another adhesive material.

18. The opto-electronic apparatus of claim 17, wherein a sum of the second protrusion thickness and a thickness of the second opto-electronic unit is greater than a sum of the first protrusion thickness and a thickness of the first opto-electronic unit.

19. The opto-electronic apparatus of claim 17, wherein the second protrusion thickness is greater than the first protrusion thickness.

\* \* \* \* \*